United States Patent [19]
Brown

[11] Patent Number: 6,098,068
[45] Date of Patent: Aug. 1, 2000

[54] INTER-MODULE DATA MANAGEMENT METHODOLOGY FOR CIRCUIT SYNTHESIS

[75] Inventor: Jeffrey R. Brown, Plymouth, Minn.

[73] Assignee: Micron Electronics, Inc., Nampa, Id.

[21] Appl. No.: 08/951,993

[22] Filed: Oct. 16, 1997

[51] Int. Cl.[7] .................................................. G06F 17/30
[52] U.S. Cl. ...................... 707/10; 707/104; 395/500.3
[58] Field of Search ..................... 707/10, 104, 1, 707/100; 395/500, 701, 710, 500.3; 364/468.03; 345/964, 961, 952; 706/919

[56] References Cited

U.S. PATENT DOCUMENTS

| | | | |
|---|---|---|---|
| 5,341,309 | 8/1994 | Kawata | 395/500.3 |
| 5,581,473 | 12/1996 | Rusu et al. | 707/1 |
| 5,659,683 | 8/1997 | Kawano et al. | 707/10 |
| 5,812,416 | 9/1998 | Gupte | 364/490 |
| 5,825,658 | 10/1998 | Ginetti et al. | 364/488 |
| 5,848,415 | 12/1998 | Guck | 707/10 |
| 5,852,825 | 12/1998 | Winslow | 707/6 |

*Primary Examiner*—Anton Fetting
*Assistant Examiner*—Greta L. Robinson
*Attorney, Agent, or Firm*—Park & Vaughan LLP

[57] ABSTRACT

One embodiment of the present invention can be characterized as a method for designing a circuit that facilitates sharing of design parameters between separately designed modules of the circuit. The method includes receiving module information, including parameters relating to design of a module of the circuit, and storing the module information in a database. The method also includes retrieving the module information from the database, and generating automatically a constraint file from the module information. In one embodiment, this constraint file includes constraints in a format suitable for use by a synthesis tool to synthesize circuitry for the module.

22 Claims, 7 Drawing Sheets

INPUT SIGNALS:

| Signal | Signal Type | Delay | Margin | Reference | Search for Source | Source Location |
|---|---|---|---|---|---|---|
| SIGNAL1 | STD_LOGIC | 4.2 | 0 | CLK | yes | MOD7.SIGNAL1 |
| SIGNAL2 | STD_LOGIC | 5.3 | 0.6 | CLK | yes | MOD7.SIGNAL2 |

OUTPUT SIGNALS:

| Signal | Signal Type | Delay | Margin | Reference | Search for Source | Source Location | Loads |
|---|---|---|---|---|---|---|---|
| SIGNAL3 | STD_LOGIC | 5.6 | -0.4 | PCLK | no | | |
| SIGNAL4 | STD_LOGIC | 7.4 | 0 | CLK | no | | |
| SIGNAL5 | STD_LOGIC | 0 | 0 | CLK | no | | 6 |
| SIGNAL6 | STD_LOGIC | 0 | 0 | CLK | no | | 8 |

COMMANDS HEADER:

| SET_WIRE_LOAD -PORT_LIST FIND(PORT, "*") "B12X12" |
|---|

COMMANDS FOOTER:

| SET_WIRE_LOAD -PORT_LIST SIGNAL3 "B8X8" |
|---|
| SET_WIRE_LOAD -PORT_LIST SIGNAL4 "B6X6" |

FIG. 4

/******** Database Generated Constraints ***************/

/*** Commands Header ***/
SET_WIRE_LOAD -PORT_LIST FIND(PORT, "*") "B12X12"

/*** Input Delays ***/
set_input_delay –clock CLK  –max 4.2  SIGNAL1
set_input_delay –clock CLK  –max 5.9  SIGNAL2

/*** Output Delays ***/
set_output_delay –clock PCLK  –max clkperiod – clkskew – 5.2  SIGNAL3
set_output_delay –clock CLK   –max clkperiod – clkskew – 7.4  SIGNAL4

/*** Loads ***/
set_load_inv * 6  SIGNAL5
set_load_inv * 8  SIGNAL6

/*** Commands Footer ***/
SET_WIRE_LOAD -PORT_LIST SIGNAL3 "B8X8"
SET_WIRE_LOAD -PORT_LIST SIGNAL4 "B6X6"

/******** User Generated Commands *****************/

FIG. 5

INTER-MODULE DATA MANAGEMENT METHODOLOGY FOR CIRCUIT SYNTHESIS

RELATED APPLICATION

This application hereby incorporates by reference the following related non-provisional application by the same inventor as the instant application, and filed on the same day as the instant application: "INTER-MODULE DATA MANAGEMENT APPARATUS FOR CIRCUIT SYNTHESIS," having Ser. No. 08/981,772, and filing date Oct. 16, 1997 (Attorney Docket No. MEI-97-02355.01).

BACKGROUND

1. Field of the Invention

The present invention relates to design methodologies for electrical circuits, and more particularly to a design methodology for application specific integrated circuits (ASICs), which allows a designer working on a module of an ASIC to more easily communicate and utilize design parameters from other designers working on different modules of the same ASIC.

2. Related Art

Circuit design is presently accomplished primarily through the use of computer aided design (CAD) tools, which take as input a circuit specification and automatically simulate and generate circuit descriptions suitable for implementation. One type of circuit commonly designed using CAD tools is an application specific integrated circuit (ASIC). ASICs are often very complex, and design of an ASIC is often accomplished by a group of designers working collectively on a single circuit or system. During the design process, ASICs are typically divided into a collection of modules, which are farmed out to different designers. This process gives rise to a number of communication problems, which can impede design progress, and can also lead to sub-optimal designs.

At the present time, modules are typically designed separately using the CAD tools, with little interaction between designers of different modules. CAD tools for circuits such as ASICs typically take as input a constraint file, specifying certain design parameters, such as worst case delay through a circuit, as well as a functional specification for the circuit. A CAD tool uses these inputs to achieve, if possible, a satisfactory design for a particular circuit module. Design parameters found in constraint files include, but are not limited to: (1) worst case delay for a signal through a module, (2) output load (capacitance) for a signal through a module, (3) size of a module, and (4) placement of the module within a circuit.

Constraint files are typically generated by hand from numbers that are agreed upon beforehand by the circuit designers. The designers will often assign a standard set of numbers for expected delays regarding a particular piece of circuitry in a constraint file. These estimated numbers are not exact, and the true numbers will often evolve over time, so that an original number will often overestimate or underestimate the ultimate value of an associated constraint. If this happens, additional design iterations may be required to achieve a satisfactory design.

Furthermore, as designs evolve during the design process, the input and output signal to a particular module can change. This presently necessitates manually editing the constraint file to reflect the new configuration of input and output signal. This re-editing process can be very time-consuming.

What is needed is a system to facilitate automatic communication of constraints between designers of different modules of a circuit, so that up-to-date constraint information is made available to designers of the different modules.

Additionally, what is needed is a process that automatically modifies a constraint file format when the underlying design changes, so that a constraint file does not need to be continually reformatted by hand when the design changes.

SUMMARY

One embodiment of the present invention can be characterized as a method for designing a circuit that facilitates sharing of design parameters between separately designed modules of the circuit. The method includes receiving module information, including parameters relating to design of a module of the circuit, and storing the module information in a database. The method also includes retrieving the module information from the database, and generating automatically a constraint file from the module information. In one embodiment, this constraint file includes constraints in a format suitable for use by a synthesis tool to synthesize circuitry for the module.

Another embodiment of the present invention includes the act of inputting parameter values into the module information stored in the database.

Yet another embodiment of the present invention includes the act of inputting parameter values into the module information stored in the database, including associating a first parameter value in the module information with a second parameter value relating to module information for another module, allowing the first parameter value to be influenced by changes to the second parameter value.

In another embodiment of the present invention, the act of inputting parameter values into the module information stored in the database is performed by a computer program using parameter values imported from an old constraint file.

In another embodiment of the present invention, the method includes extracting the module information from a module design file before receiving the module information.

In yet another embodiment of the present invention, the method includes extracting updated module information from an updated first module design file for the module before receiving the first module information. It also includes using the updated module information to generate an updated format for the module information, and using the updated format to generate the constraint file for the module.

Another embodiment of the present invention can be characterized as a program storage device storing instructions that when executed by a computer perform a method for designing a circuit that facilitates sharing of design parameters between separately designed modules of the circuit. The method includes receiving module information, including parameters relating to design of a module of the circuit, and storing the module information in a database. The method also includes retrieving the module information from the database, and generating automatically a constraint file from the module information. In one embodiment, the constraint file includes constraints used by a synthesis tool to synthesize circuitry for the module.

One embodiment of the present invention can be characterized as an apparatus for designing a circuit that facilitates sharing of design parameters between separately designed modules of the circuit. This embodiment includes a mechanism coupled to the apparatus that receives module information, including parameters relating to design of a module of the circuit. This embodiment also includes a mechanism coupled to the apparatus that stores the module information in a database. This embodiment further includes a mechanism coupled to the apparatus that retrieves the module information from the database. Additionally, this embodiment includes a mechanism coupled to the apparatus that generates automatically a constraint file from the module information, the constraint file including constraints used by a synthesis tool to synthesize circuitry for the module.

DESCRIPTION OF THE FIGURES

FIG. 4 is a diagram illustrating one embodiment of the contents of a database file of module information.

FIG. 5 is a diagram illustrating one embodiment of the contents of a constraint file related to a module.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
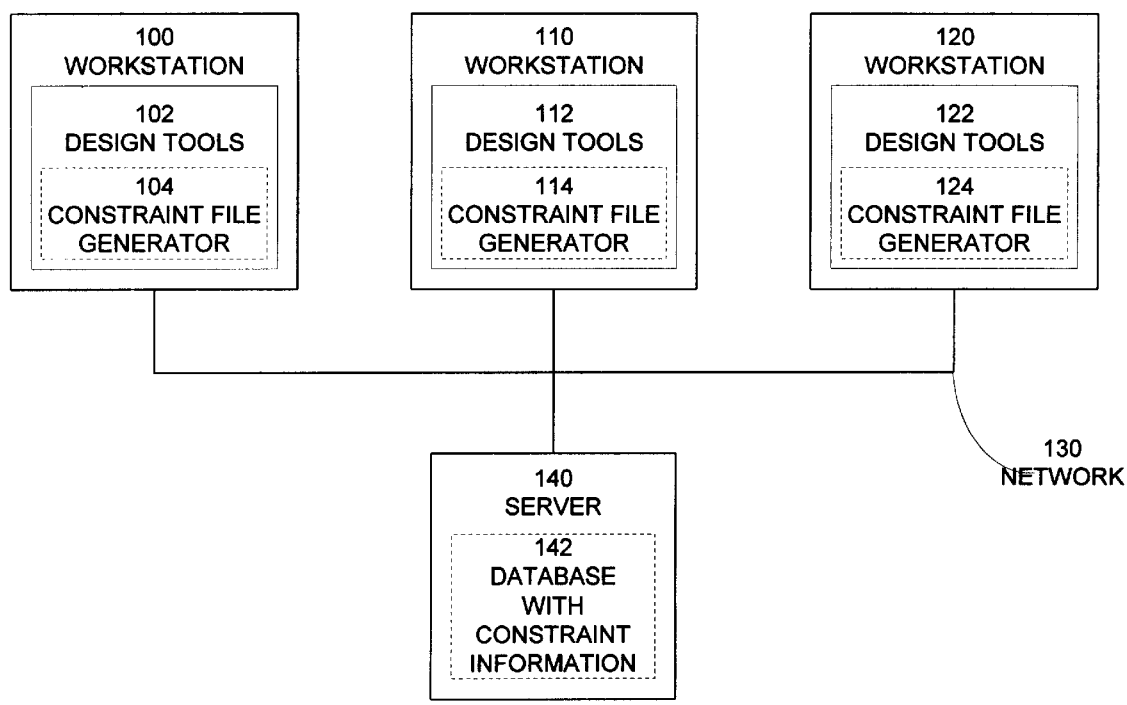
FIG. 1 is a block diagram illustrating a plurality of workstations 100, 110 and 120 coupled through network 130 to server 140 in accordance with an embodiment of the present invention.

FIG. 1 is a block diagram illustrating one embodiment of a computing system upon which the present invention may operate. FIG. 1 includes a plurality of workstations 100, 110 and 120, coupled to server 140 through network 130. Workstations 100, 110 and 120 may be any type of computing system on which CAD tools may be run. This includes, but is not limited to workstations, personal computers, mainframe computers, supercomputers and device controllers. Network 130 may be any type of communication network through which computers can communicate. This includes, but is not limited to, local area networks, such as Ethernet or Token ring networks, and wide area networks, such as the Internet. Server 130 is any type of computational server capable of storing data that can be accessed by other computer systems over network 130.

Workstation 100 includes design tools 102, which are computer aided design (CAD) tools for designing electrical circuitry. In one embodiment, design tools 102 are configured to design application specific integrated circuits (ASICs). In another embodiment, design tools 102 include tools to perform placement and routing of ASIC circuitry, as well as tools to simulate and test an ASIC layout. Design tools 102 may also include constraint file generator 104, which may include resources to generate a file of constraints for a module of a circuit. In one embodiment, this file of constraints is used by a circuitry synthesis tool to produce an ultimate layout of a circuit suitable for implementation. Workstation 110 may similarly include a corresponding set of design tools 112, which may include a corresponding constraint file generator 114. Workstation 120 may also include a corresponding set of design tools 122, which may include a constraint file generator 124.

FIG. 1 illustrates a system with only three workstations, 100, 110 and 120. However, the present invention is applicable to systems including any number of workstations connected to server 140. The present invention may additionally be used on any type of computing system that allows a plurality of designers to access a shared database of constraint information. In one embodiment, the present invention is achieved on a mainframe computer.

Server 140 may include a data storage medium for storing shared data. In one embodiment, this takes the form of a plurality of magnetic disk drives. Server 140 may also include database with constraint information 142, which is any type of database system that permits access by multiple users. Database with constraint information 142 may include constraint information for modules, which is shared between designers working on related modules, and is ultimately used to generate constraint files for use by a module synthesis tool.

Description of Functional Components

Figure 2:
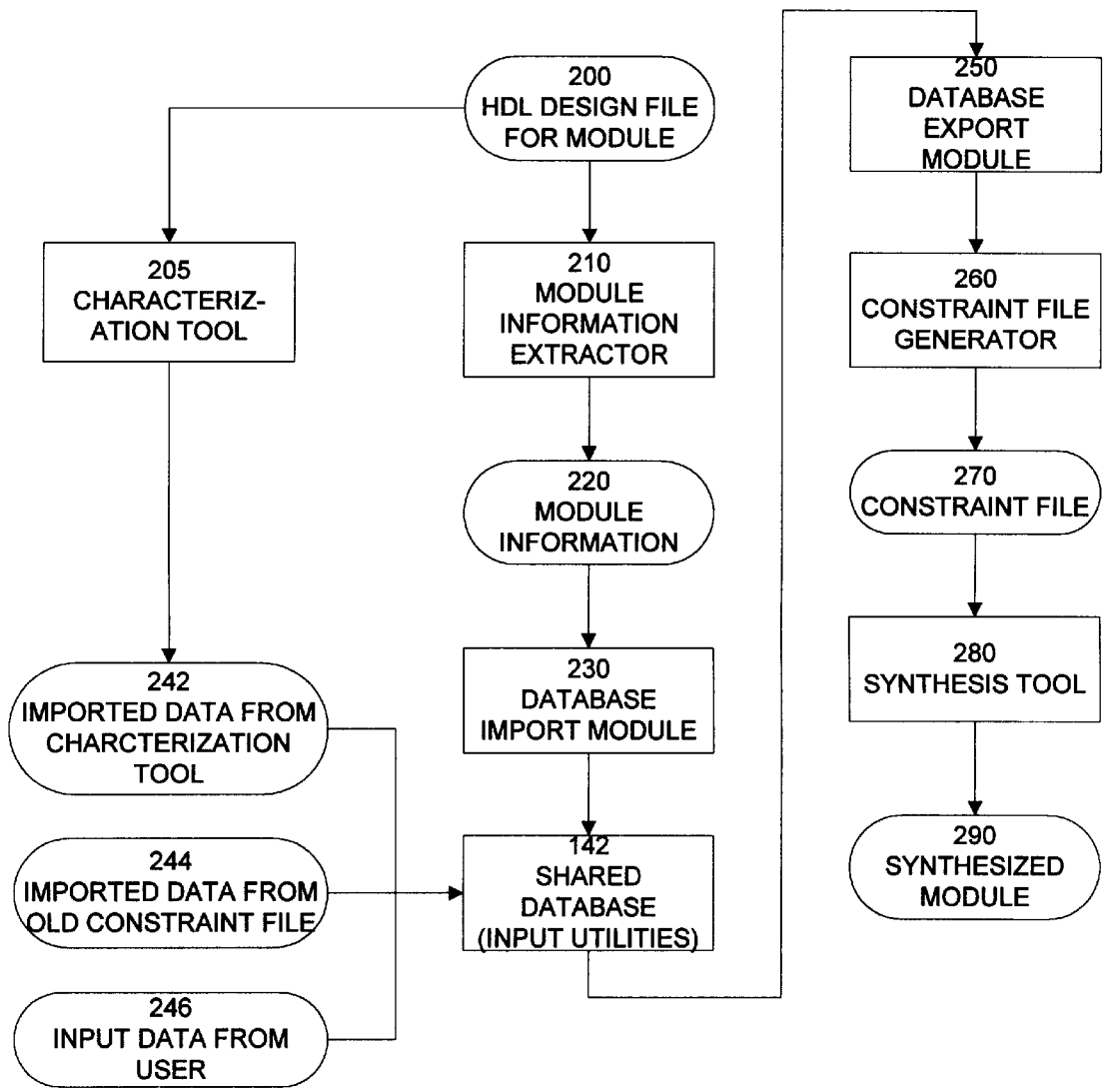
FIG. 2 is a flow diagram illustrating operation of some of the major functional components of a system for sharing constraint information between circuit designers in accordance with an embodiment of the present invention.

FIG. 2 is a flow diagram illustrating operation of some of the major functional components of a system for sharing constraint information between circuit designers in accordance with an embodiment of the present invention. FIG. 2 includes collections of data, represented by rounded rectangles, and functional tools and modules for manipulating the collections of data, represented by normal rectangles.

One embodiment of the design methodology starts with HDL design file 200, which is a file in a Hardware Description Language (HDL), that functionally specifies the details of operation of a module of a circuit to be designed. In one embodiment, this file is in the form of a VHSIC Hardware Description Language (VHDL) specification of the circuit. (VHSIC is a department of defense acronym that stands for very high speed integrated circuits.) The VHDL standard has been codified in Institute for Electrical and Electronic Engineers (IEEE) standard 1076-1993.

HDL design file 200 feeds into module information extractor 210, which extracts certain constraint parameters and constraint formats from HDL design file 200. In one embodiment, module information extractor 210 is a C program that extracts input and output signal for the module from HDL design file 200 in VHDL form, and formats the input and output signal into MICROSOFT ACCESS™ form, for storage in database with constraint information 142.

Module information extractor 210 produces module information 220. In one embodiment, module information 220 includes delay and loading values for input and output signal to the module. In another embodiment, this delay includes a worst case delay for signal through the circuit. In yet another embodiment, the load includes a maximum number of inverter inputs an output to the module will have to drive. In another embodiment, module information 220 includes size and placement information for the module.

Module information 220 is accessed by database import module 230, which imports the contents of module information 220 into shared database 142. In one embodiment, database import module 230 is a VISUAL BASIC™ program that calls database routines to import module information into shared database 142. However, any program or script that can perform similar database manipulations can be used to implement database import module 230.

Thus, module information 220 ends up in shared database 142, which is any type of database system that can be accessed by a plurality of circuit designers working on different modules of a circuit. In one embodiment, shared database 142 is accessed by programs written in VISUAL BASIC™.

Once module information 220 is imported into shared database 142, parameters within module information 220 may be manipulated. Such manipulations may include inputting new values into the parameters. These new values can originate from a variety of sources. New values can be inputted into the database manually by a user 246. For example, a parameter value, such as a worst case delay can be changed manually by the designer as it evolves during the design process. Alternatively, parameter values may be imported from an old constraint file 244. Thus, relieving a designer of the burden of manually re-entering the parameter values. Another alternative is to import the parameter values from a characterization tool 205. Characterization tool 205 takes as input HDL design file 200, and attempts to characterize the proper parameter values through different estimation techniques.

Once parameter values are properly entered into shared database 142, database export module 250 exports the constraint information from shared database 142. In one embodiment, database export module 250 is implemented as a VISUAL BASIC™ program that calls database routines to export module information from shared database 142.

Next, the module information is fed through constraint file generator 260, which generates constraint file 270. Constraint file generator 260 reformats module information 220 into a form suitable for input into synthesis tool 280. In one embodiment, constraint file generator 260 is implemented as a "C" program that converts module information 220 from MICROSOFT ACCESS™ format into a constraint file format for a SYNOPSIS™ synthesis tool.

Finally, constraint file 270 feeds into synthesis tool 280, which additionally receives input (not shown) from HDL design file 270, and produces synthesized module 290. Synthesized module 290 includes a final layout for the module suitable for implementation in an ASIC. In one embodiment, synthesis tool 280 is a SYNOPSYS™ synthesis tool for ASIC circuitry. However, any comparable synthesis tool that operates on a functional description of a module along with a constraint file for the module may be used.

Description of System Architecture

Figure 3:
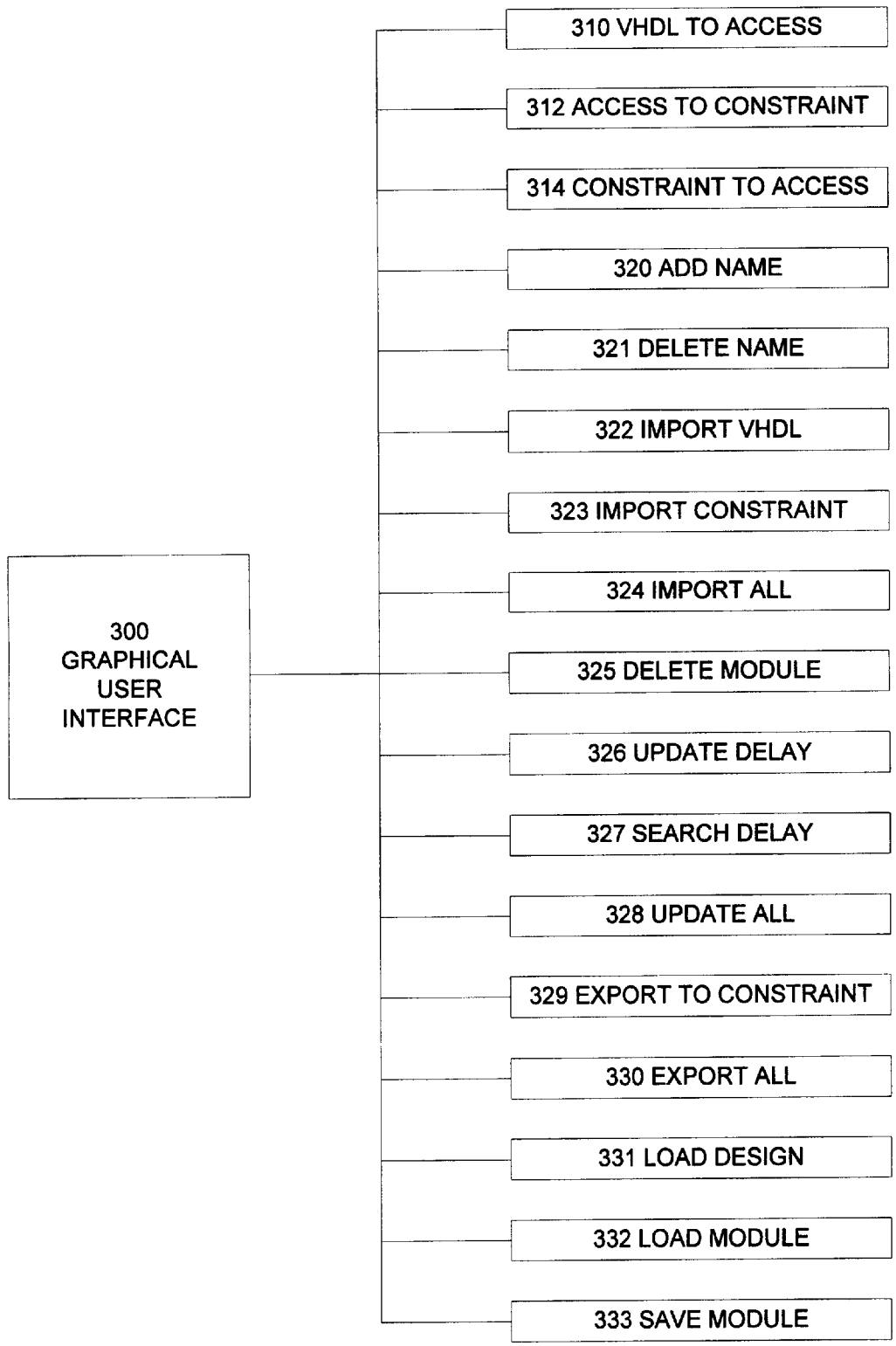
FIG. 3 is a diagram illustrating the structure of a system for sharing constraint information between designers in accordance with an embodiment of the present invention.

FIG. 3 is a diagram illustrating the structure of a system for sharing constraint information between designers in accordance with an embodiment of the present invention. The system in FIG. 3 is controlled by a user through graphical user interface 300, through which a user can selectively activate a variety of modules and other programs to facilitate sharing of constraint information between designers of different modules.

The system may include a variety of external software modules. In one embodiment, these external software modules are written in the "C" programming language. (1) VHDL to Access module 310 takes as input a HDL design file 200 in VHDL format. It selectively extracts information from design file 200, and converts in into MICROSOFT ACCESS™ format. (2) Access to constraint module 312 generates a constraint file 270. In doing so, it takes data in MICROSOFT ACCESS™ format, and converts it into a format suitable for a synthesis tool 280. (3) Constraint to Access module 314 goes the other direction, and converts data in constraint file format to MICROSOFT ACCESS™ format.

The system may also include a variety of internal software modules. In one embodiment, these internal software modules are written in the "VISUAL BASICS™" programming language. One embodiment includes the following modules that perform the following functions. Add name module 320 adds a module name to a list in database 142. Delete name module 321 deletes a module name from the list in database 142. Import VHDL 322 imports signal names from a specified VHDL hardware module. Import constraint module 323 imports signal data from a specified constraint file. Import all module 324 imports all hardware modules that are in the list of modules in database 142. Delete module 325 deletes all data for a specified hardware module. Update delay module 326 updates delay information for a specified hardware module. Search delay module 327 searches database 142 for delay information for a specified module signal. Update all module 328 runs the update delay module 326 for all hardware modules that are in the list of modules in database 142. Export constraint module 329 exports signal information for a specified hardware module to a constraint file 270. Export all module 330 runs export constraint module 329 for all hardware modules that are in the list of modules in database 142. Load design module 331 loads all the modules in the list of modules in database 142 into a main form. This main form allows a user to view and selectively edit data contained in the form. Load module 332 loads database information for a specified hardware module into the main form. Save module 333 saves the loaded module information from the main form.

Description of Data Formats

FIG. 4 is a diagram illustrating one embodiment of the contents of a database file of module information in accordance with an embodiment of the present invention. In this embodiment, the file includes a plurality of inputs, including: signal 1 and signal 2. FIG. 4 illustrates a simple example including two inputs and four outputs. For more complicated modules, there may be dozens, or even hundreds of inputs and outputs. In the illustrated embodiment, each input and output includes an associated signal type, which specifies a type for each signal, and all signal are of the type STD_LOGIC, which indicates they are standard logic signal.

Each input and output may additionally include an associated delay value, which specifies a delay for the signal. Each delay value may also include an associated margin, which indicates a margin for the delay about the delay value. In this example, input signal 1 has a delay of 4.2, which indicates a 4.2 nanosecond delay, and a margin of zero. Input signal 2 has a delay of 5.3, which indicates a 5.3 nanosecond delay, and a margin of 0.6, which means the input delay may be as large as 5.9 nanoseconds. Output signal 3 has a delay of 5.6, which indicates a 5.6 nanosecond delay, and a margin of −0.4, which means the output delay may be as small as 5.2 nanoseconds. Output signal 4 has a delay of 7.4, which indicates a 7.4 nanosecond delay, and a margin of zero. Each signal may additionally include an associated reference value, which specifies a reference signal from which the delay is measured. This reference signal is typically a clock signal. In the illustrated embodiment, signal 3 has a reference signal PCLK, which specifies a clock for a peripheral bus. All other signal have a reference signal CLK, which indicates they are referenced relative to the system clock.

Each signal also may include a field labeled "search for source," and an associated search location, which together are used to trigger the system to search for the source of a signal in a different module. In the illustrated embodiment, input signal 1 is associated with a signal 1 from module 7, and input signal 2 is associated with a signal 2 from module 7. These associations indicate that the system should first find signal 1 and signal 2 in module 7, and use these signal to resolve constraints for signal 1 and signal 2 in the instant module. For example, the delay for signal 2 would be the delay for signal 2 from module 7, including an associated margin of 0.6 nanoseconds.

Each output signal also may be associated with a load value, which indicates the number of loads a signal is tied to. In one embodiment, a single load represents the input capacitance of a single inverter. For example, a load value of 6 indicates that the signal is coupled to the equivalent of 6 inverter inputs. In another embodiment, the load value is a function of the length of wire a signal must propagate across. In this embodiment, the load value is dependent upon the ultimate placement and routing of modules in the circuit. In the illustrated embodiment, signal 5 has a load value of 6, which indicates that it must drive the equivalent of 6 inverter inputs. Signal 6 has a load value of 8, which indicates that it must drive the equivalent of 8 inverter inputs.

FIG. 4 additionally includes a "commands header" section and a "commands footer" section, which can be used to input header commands, that precede all other database entries in the ultimate constraint file, and footer commands, that follow all other commands in the ultimate constraint file. In this example, the commands header section specifies that all wire loads and "12×12," which represents a specific load value based upon a specified transistor size. The commands footer section specifies that the wire load value for signal 3 is "8×8," and the wire load value for signal 4 is "6×6." These wire load values will supercede the default value of "12×12" for signal 3 and signal 4.

FIG. 5 is a diagram illustrating one embodiment of the contents of a constraint file related to a module in accordance with an embodiment of the present invention. This constraint file contains most of the same information as appears in the database file illustrated in FIG. 4, except that the information is expressed in different form. The first command, which originated from the "commands header" section of FIG. 4, specifies a default load value of "12×12 for all output signal. The next commands set the input delays, which are calculated as worst case delays by taking the delay value and adding the margin. In the illustrated embodiment, signal 1 has a worst case delay of 4.2 nanoseconds and signal 2 has a worst case delay of 5.9 nanoseconds. The next commands set the output delays, which again are calculated by taking the delay value and adding the margin. In the illustrated embodiment, signal 3 has a worst case delay of 6 nanoseconds, and signal 4 has a worst case delay of 7.4 nanoseconds. The next set of commands sets load values for output signal. A pair of commands sets signal 5 to a load value of 6 inverters, and signal 6 to a load value of 8 inverters. Finally, a pair of commands sets wire load values of "8×8" and "6×6," for signal 3 and signal 4 respectively. These commands originated from the "commands footer" section of FIG. 4.

Below these commands is a space for user generated commands, which allows a user to manually input constraints if the user desires.

Description of the Methodology

Figure 6:
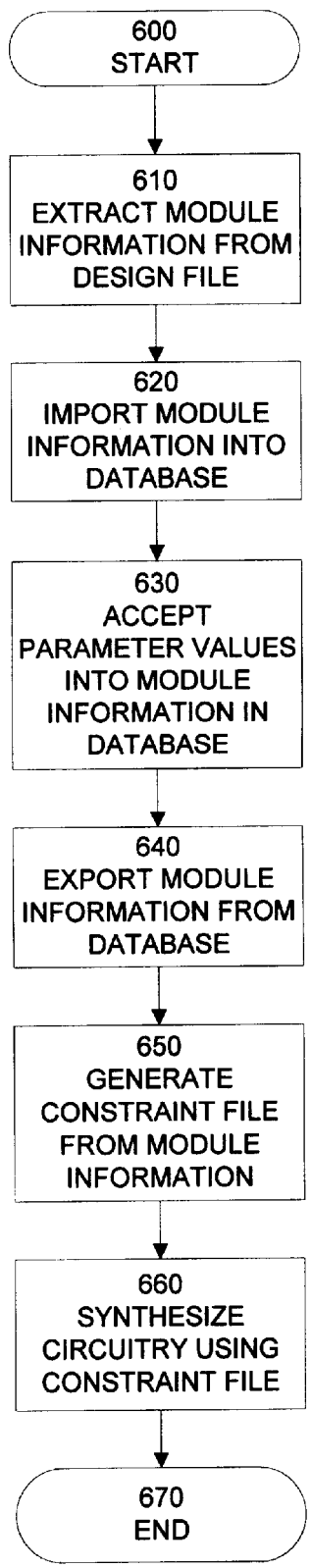
FIG. 6 is a flow chart illustrating some of the major functional operations of a system for sharing constraint information between circuit designers in accordance with an embodiment of the present invention.

FIG. 6 is a flow chart illustrating some of the major functional operations of a system for sharing constraint information between circuit designers in accordance with an embodiment of the present invention. FIG. 6 starts at state 600, which is a start state. The system next advances to state 610. At state 610, the system extracts module information from a design file. As mentioned previously, in one embodiment this module information includes load and delay signal. In one embodiment, these signal are in the form a signal list. In another embodiment, this module information includes module size and placement information. The system next advances to state 620. In state 620, the system imports the module information into a database. The system next advances to state 630. At state 630, the system accepts new parameter values into the database. The system next advances to state 640. In state 640, the system exports the module information from the database. The system next advances to state 650. In state 650, the system generates a constraint file from the module information. The system next advances to state 660. At state 660, the system synthesizes circuitry from the constraint file using a synthesis tool, such as synthesis tool 280. The system next advances to state 670, which is an end state.

Description of an Example

Figure 7:
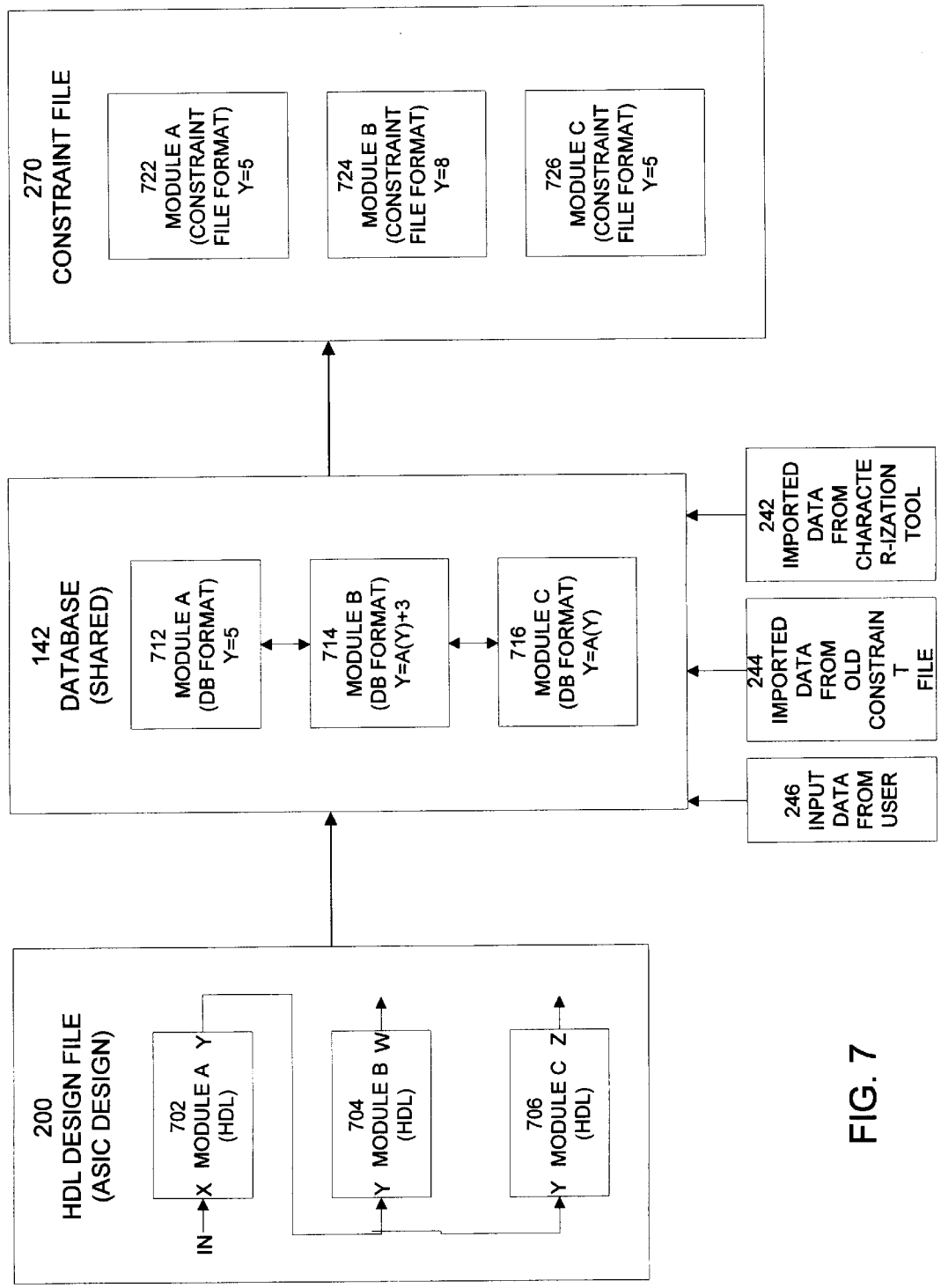
FIG. 7 is a diagram illustrating an example of how constraint information is shared between different modules in accordance with an embodiment of the present invention.

FIG. 7 is a diagram illustrating an example of how constraint information is shared between different modules in accordance with an embodiment of the present invention. The example illustrated in FIG. 7 includes module information stored in three forms. First, is HDL design file 200, which may include a functional specification for the module in HDL format. Second, is database 142, which may contain extracted module information 142. Third, is constraint file 270, which may contain constraint information in a form suitable for input into a synthesis tool, such as synthesis tool 280.

In this example, HDL design file 200 includes HDL code that specifies three modules. These include: module A 702, module B 704, and module C 706. Module A 702 includes an input X, which accepts a signal IN, and an output Y which feeds into inputs of modules B and C. Module B 704 accepts the input Y and produces an output W. Module C 706 accepts the input Y and produces an output Z.

Database 142, includes extracted module information 220 from HDL design file 200. This includes information from module A 712, information from module B 714, and information from module C 716. Information from module A includes a notation that signal Y has a delay of 5 nanoseconds. Information from module B 714 includes a notation that the delay associated signal Y in module B depends is the delay associated with signal Y in module A plus three nanoseconds. Information from module C 716 includes a notation that the delay associated signal Y in module C depends upon the delay associated with signal Y in module A.

Once the extracted module information is imported into database 142, it can receive input parameters from a variety of sources (as mentioned in the discussion for FIG. 2): new values can be inputted into the database manually by a user 246; parameter values may be imported from an old constraint file 244; and parameter values from a characterization tool 205.

Constraint file generator 260 formats data exported from database 142 into constraint file 270, in constraint file form. In this example, constraint information for module A 722 includes the fact that the delay for signal Y is 5 nanoseconds. Constraint file information for module B 724 includes the fact that the delay for signal Y is 5+3=8 nanoseconds. Constraint file information for module C 726 similarly includes the fact that the delay for signal Y is 5 nanoseconds.

The foregoing descriptions of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A method for designing a circuit that facilitates sharing of design parameters between separately designed modules of the circuit, the method comprising:

receiving first module information, including parameters relating to design of a first module of the circuit;

storing the first module information in a database;

receiving second module information, including parameters relating to design of a second module of the circuit, the second module being separately designed from the first module;

storing the second module information in the database;

establishing a functional relationship between a first parameter value in the first module information with a second parameter value in the second module information;

retrieving the first module information and the second module information from the database; and generating automatically a set of constraints from the first module information and the second module information as well as the functional relationship, so that the functional relationship is preserved between a first constraint associated with the first parameter value and a second constraint associated with the second parameter value, the set of constraints being subsequently used by a circuit synthesis tool to synthesize the circuit.

2. The method of claim 1, wherein the act of receiving the first module information includes receiving signal timing information for input and output signal of the first module.

3. The method of claim 1, wherein the act of receiving the first module information includes receiving worst case timing delays for input and output signal of the first module.

4. The method of claim 1, wherein the act of receiving the first module information includes receiving load information for output signal from the first module.

5. The method of claim 1, wherein the act of receiving the first module information includes receiving placement information for the first module.

6. The method of claim 1, wherein the act of receiving the first module information includes receiving size information regarding the size of the first module.

7. The method of claim 1, wherein the act of generating automatically the set of constraints includes generating constraints in a form suitable for use by the circuit synthesis tool to synthesize circuitry for the first module and the second module.

8. The method of claim 1, including inputting parameter values into the first module information stored in the database.

9. The method of claim 8, wherein the act of inputting parameter values into the first module information stored in the database, includes inputting a constant value into the first module information stored in the database.

10. The method of claim 8, wherein the act of inputting parameter values into the first module information stored in the database, includes associating the first parameter value in the first module information with the second parameter value in the second module information, thereby allowing the first parameter value to be influenced by changes to the second parameter value.

11. The method of claim 8, wherein the act of inputting parameter values into the first module information stored in the database, includes associating the first parameter value in the first module information with a plurality of parameter values relating to a plurality of other modules, so that the first parameter value may be influenced by changes to the plurality of other parameter values.

12. The method of claim 8, wherein the act of inputting parameter values into the first module information stored in the database includes automatically providing a default value as a parameter value for the first module information stored in the database.

13. The method of claim 8, wherein the act of inputting parameter values into the first module information stored in the database is performed manually by a human user.

14. The method of claim 8, wherein the act of inputting parameter values into the first module information stored in the database is performed by computer code using parameter values imported from an old set of constraints.

15. The method of claim 1, including extracting the first module information from a first module design file before receiving the first module information.

16. The method of claim 15, wherein the act of extracting the first module information from the first module design file includes extracting the first module information from the first module design file in hardware description language (HDL) format.

17. The method of claim 15, wherein the act of extracting the first module information from the first module design file includes extracting the first module information from the first module design file in very high speed integrated circuit hardware description language (VHDL) format.

18. The method of claim 15, wherein the act of extracting the first module information from the first module design file includes extracting the first module information from the first module design file in VERILOG™ format.

19. The method of claim 1, including:

extracting the first module information from a first module design file before receiving the first module information; and inputting parameter values into the first module information stored in the database using the first module information extracted from the first module design file.

20. The method of claim 1, including:

extracting updated first module information from an updated first module design file for the first module before receiving the first module information;

using the updated first module information to generate an updated format for the first module information; and using the updated format to generate the set of constraints for the first module.

21. A method for designing a circuit that facilitates sharing of design parameters between separately designed modules of the circuit, the method comprising:

extracting first module information from a first module design file, the first module design file containing a specification of the design of a first module of the circuit;

extracting second module information from a second module design file, the second module design file containing a specification of the design of a second module of the circuit, the second module being sega-
rately designed from the first module;

importing the first module information into a database;

importing the second module information into the database;

inputting parameter values into the first module information and the second module information stored in the database;

establishing a functional relationship between a first parameter value in the first module information with a second parameter value in the second module information;

exporting the first module information and the second module information from the database;

generating automatically a set of constraints from the first module information and the second module information as well as the functional relationship, so that the functional relationship is preserved between a first constraint associated with the first parameter value and a second constraint associated with the second parameter value; and synthesizing circuitry for the first module and the second module using constraints from the set of constraints.

22. The method of claim 21, wherein the act of generating automatically the set of constraints includes generating constraints in a form suitable for use by a synthesis tool to synthesize circuitry for the first module.

* * * * *